(12) United States Patent
Crotty

(10) Patent No.: US 8,279,624 B2
(45) Date of Patent: Oct. 2, 2012

(54) BOARD LEVEL ELECTROMAGNETIC INTERFERENCE (EMI) SHIELDS WITH THROUGH HOLE LATCHING MECHANISMS

(75) Inventor: Paul Crotty, East Stroudsburg, PA (US)

(73) Assignee: Laird Technologies, Inc., Earth City, MO (US)

( * ) Notice: Subject to any disclaimer, the term of this patent is extended or adjusted under 35 U.S.C. 154(b) by 217 days.

(21) Appl. No.: 12/793,246

(22) Filed: Jun. 3, 2010

(65) Prior Publication Data

US 2011/0299262 A1 Dec. 8, 2011

(51) Int. Cl.
H05K 5/00 (2006.01)
(52) U.S. Cl. .................. 361/816; 361/799; 361/818
(58) Field of Classification Search .................. 361/800, 361/818, 816, 753, 799, 600; 174/350, 377, 174/177
See application file for complete search history.

(56) References Cited

U.S. PATENT DOCUMENTS

| | | |
|---|---|---|
| 3,208,511 A | 9/1965 | McAdam |
| 4,754,101 A | 6/1988 | Stickney et al. |
| 5,175,395 A | 12/1992 | Moore |
| 5,241,453 A | 8/1993 | Bright et al. |
| 5,354,951 A | 10/1994 | Lange, Sr. et al. |
| 5,414,597 A | 5/1995 | Lindland et al. |
| 5,508,889 A * | 4/1996 | Ii ................................ 361/816 |
| 5,566,052 A | 10/1996 | Hughes |
| 5,717,248 A | 2/1998 | Neumann et al. |
| 6,060,659 A * | 5/2000 | Borowiec et al. ............. 174/372 |
| 6,266,877 B1 * | 7/2001 | Borowiec et al. ............... 29/887 |
| 6,420,649 B1 * | 7/2002 | Kahl et al. ..................... 174/377 |
| 6,434,004 B1 | 8/2002 | Matteson |
| 7,351,107 B1 * | 4/2008 | Burlock ................... 439/607.37 |
| 7,463,496 B2 | 12/2008 | Robinson et al. |
| 7,504,592 B1 | 3/2009 | Crotty, Jr. |
| 7,534,968 B2 | 5/2009 | English et al. |
| 7,999,195 B2 * | 8/2011 | Huang et al. .................. 174/382 |
| 2003/0107881 A1 | 6/2003 | Muramatsu et al. |
| 2007/0139904 A1 | 6/2007 | English et al. |
| 2007/0211436 A1 | 9/2007 | Robinson et al. |
| 2008/0043453 A1 * | 2/2008 | Horng ........................... 361/818 |
| 2009/0057003 A1 | 3/2009 | Crotty, Jr. |
| 2009/0207579 A1 | 8/2009 | Boetto et al. |

OTHER PUBLICATIONS

International Search Report and Written Opinion dated Dec. 21, 2011 from PCT application No. PCT/US2011/038084 which claims priority to the instant application; 10 pages.

* cited by examiner

*Primary Examiner* — Hung S Bui
(74) *Attorney, Agent, or Firm* — Harness, Dickey & Pierce, P.L.C.

(57) ABSTRACT

Disclosed herein are exemplary embodiments of EMI shielding apparatus (e.g., one-piece shields, multi-piece shields, frames, etc.) having one or more latching members insertable into openings or holes in a substrate (e.g., printed circuit board, etc.) and engagable to the substrate. The engagement of the latching members with the substrate mechanically attaches the EMI shielding apparatus to the substrate.

25 Claims, 15 Drawing Sheets

BOARD LEVEL ELECTROMAGNETIC INTERFERENCE (EMI) SHIELDS WITH THROUGH HOLE LATCHING MECHANISMS

FIELD

The present disclosure generally relates to shields suitable for shielding components on a printed circuit board from electromagnetic interference (EMI)/radio frequency interference (RFI).

BACKGROUND

This section provides background information related to the present disclosure which is not necessarily prior art.

Electronic equipment often generates electromagnetic signals in one portion of the electronic equipment that may radiate to and interfere with another portion of the electronic equipment. This electromagnetic interference (EMI) can cause degradation or complete loss of important signals, thereby rendering the electronic equipment inefficient or inoperable. To reduce the adverse effects of EMI, electrically conducting (and sometimes magnetically conducting) material is interposed between the two portions of the electronic circuitry for absorbing and/or reflecting EMI energy. This shielding may take the form of a wall or a complete enclosure and may be placed around the portion of the electronic circuit generating the electromagnetic signal and/or may be placed around the portion of the electronic circuit that is susceptible to the electromagnetic signal. For example, electronic circuits or components of a printed circuit board (PCB) are often enclosed with shields to localize EMI within its source, and to insulate other devices proximal to the EMI source.

As used herein, the term electromagnetic interference (EMI) should be considered to generally include and refer to both electromagnetic interference (EMI) and radio frequency interference (RFI) emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

SUMMARY

This section provides a general summary of the disclosure, and is not a comprehensive disclosure of its full scope or all of its features.

Disclosed herein are exemplary embodiments of EMI shielding apparatus (e.g., one-piece shields, multi-piece shields, frames, etc.) having one or more latching members insertable into openings or holes in a substrate (e.g., printed circuit board, etc.) and engagable to the substrate. The engagement of the latching members with the substrate mechanically attaches the EMI shielding apparatus to the substrate. Other aspects of the present disclosure relate to devices that include EMI shielding apparatus. Further aspects of the present disclosure relate to methods of providing EMI shielding and installing an EMI shielding apparatus to a substrate.

An exemplary embodiment of an EMI shielding apparatus may be used for providing electromagnetic interference (EMI) shielding for one or more components on a substrate. The substrate has one or more holes or opening therein. In this example embodiment, the shielding apparatus generally includes one or more walls and one or more latching members depending downwardly from the corresponding one or more walls. The one or more latching members are configured to be insertable into the corresponding one or more holes in the substrate when the one or more latching members are in a pre-installed configuration. Thereafter, the one or more latching members may be engaged with the substrate when the one or more latching members are moved relative to the one or more walls into an installed configuration. The engagement of the one or more latching members with the substrate mechanically attaches the EMI shielding apparatus to the substrate.

Another exemplary embodiment provides a method of installing an electromagnetic interference (EMI) shielding apparatus to a substrate having one or more holes. In this example embodiment, the method generally includes placing the shielding apparatus on the substrate to insert one or more latching members of the shielding apparatus into the corresponding one or more holes in the substrate. A force may then be applied for compressing the shielding apparatus against the substrate to cause the one or more latching members to move relative to the shielding apparatus and substrate into engagement with the substrate, to thereby mechanically attach the shielding apparatus to the substrate.

In a further exemplary embodiment, a device generally includes a printed circuit board and a shielding apparatus. The printed circuit board includes a ground plane and one or more holes therein. The shielding apparatus includes one or more latching members within the one or more holes. The one or more latching members have one or more end portions engaged with the printed circuit board, such that the EMI shielding apparatus is mechanically attached to the printed circuit board. The one or more latching member may be electrically connected to the ground plane to provide an electrically conductive path from the shielding apparatus to the ground plane. Additionally, or alternatively, the shielding apparatus may be soldered to the printed circuit board.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 12:
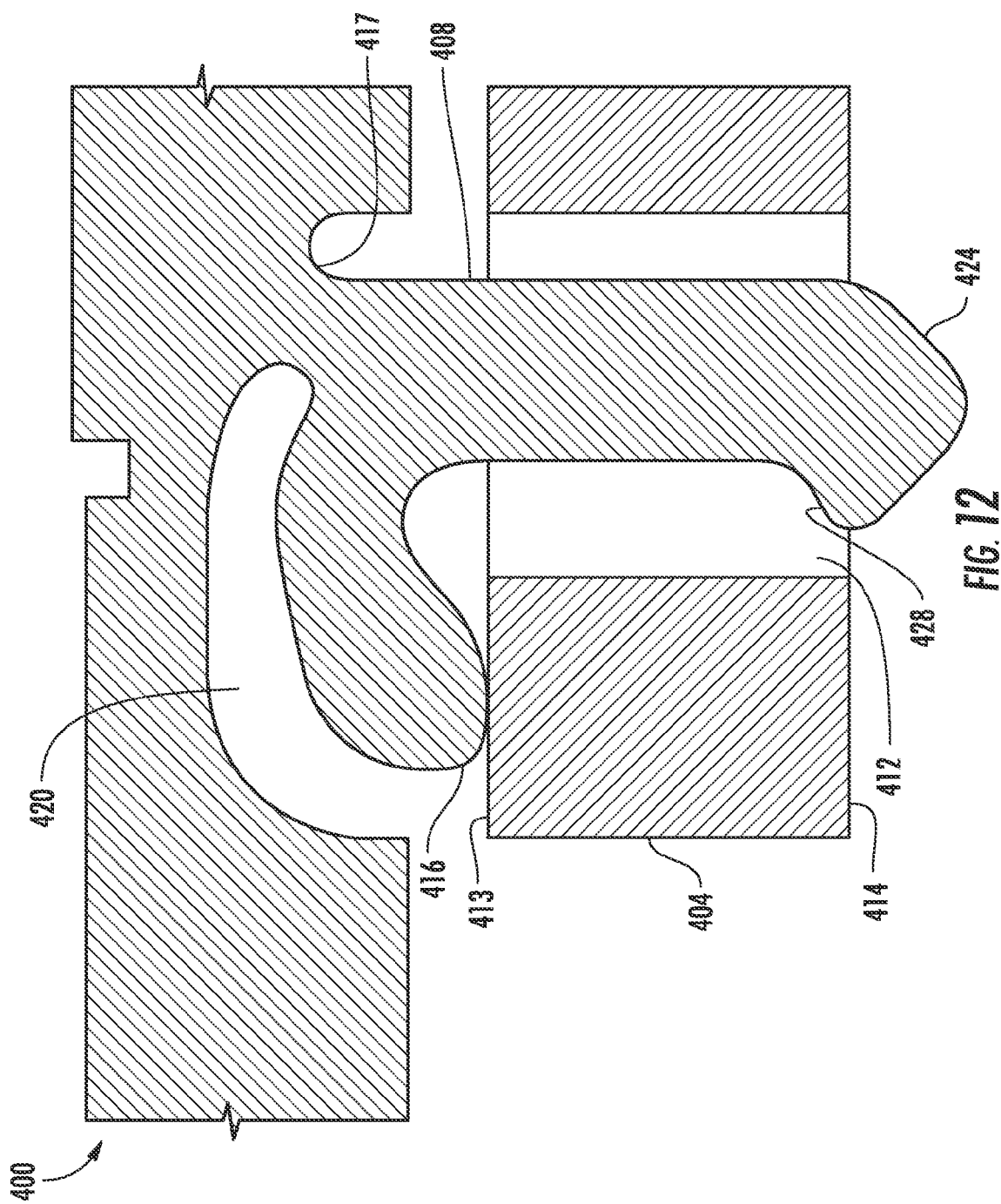
FIG. 12 illustrates a portion of the EMI shielding apparatus shown in FIG. 11 positioned on a printed circuit board, and also illustrating one of the latching members inserted into a thru-hole in a pre-installed configuration prior to engagement with the printed circuit board.
Figure 13:
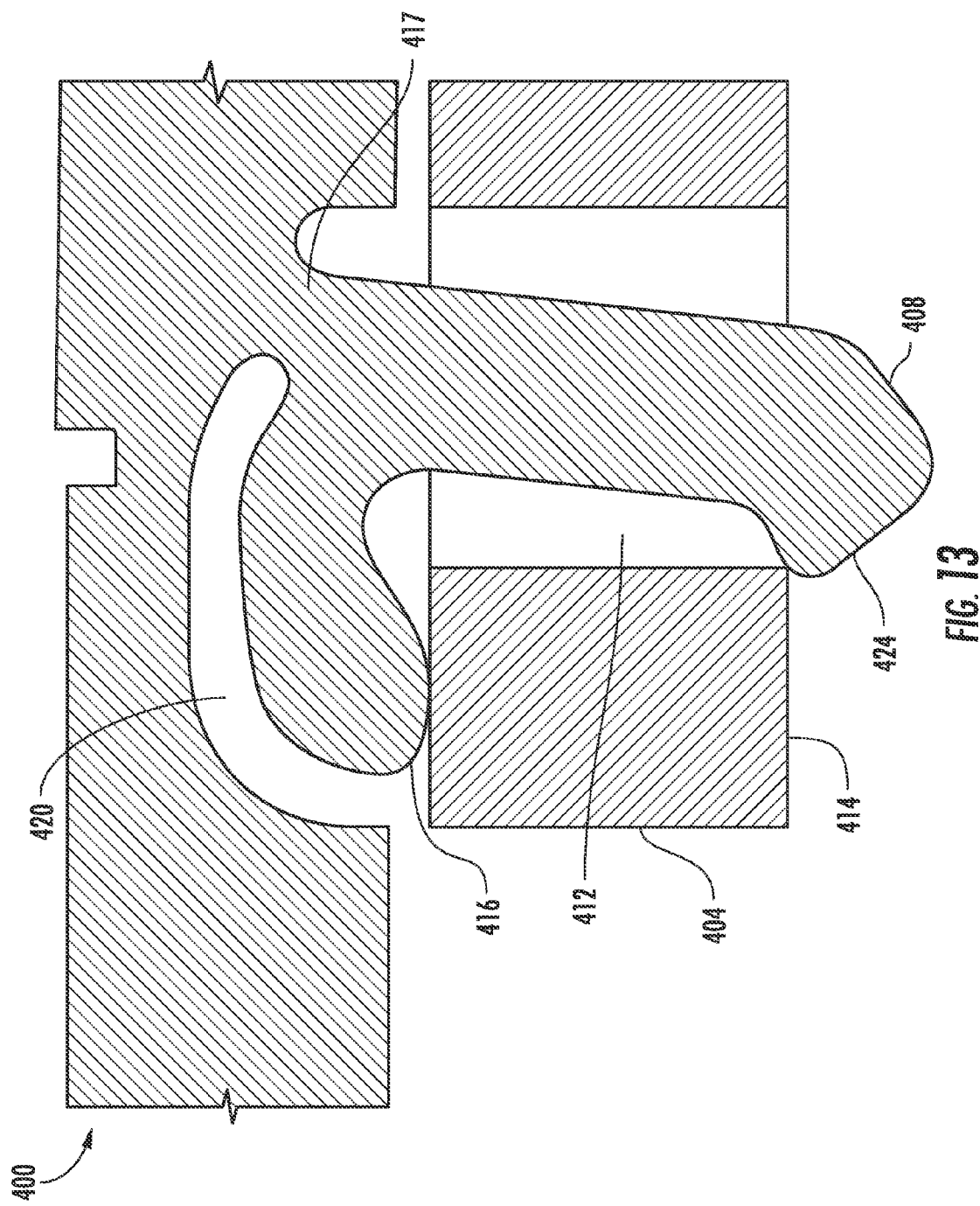
FIG. 13 illustrates the portion of the EMI shielding apparatus shown in FIG. 12 wherein a force is compressing/moving the EMI shielding apparatus downwardly onto or relatively toward the printed circuit board such that the latching member has been moved from the pre-installed configuration to an intermediate configuration.
Figure 14:
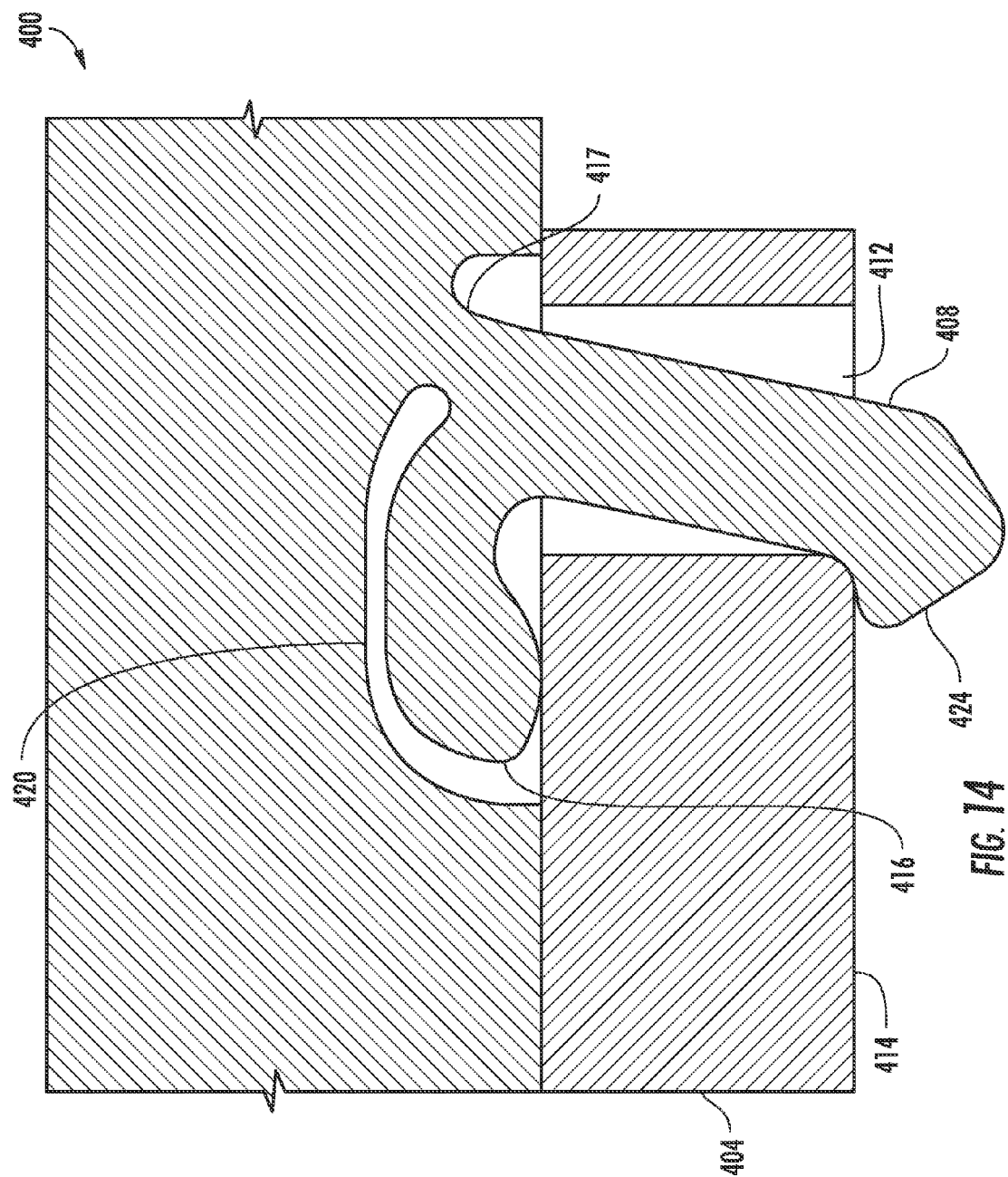
Figure 15:
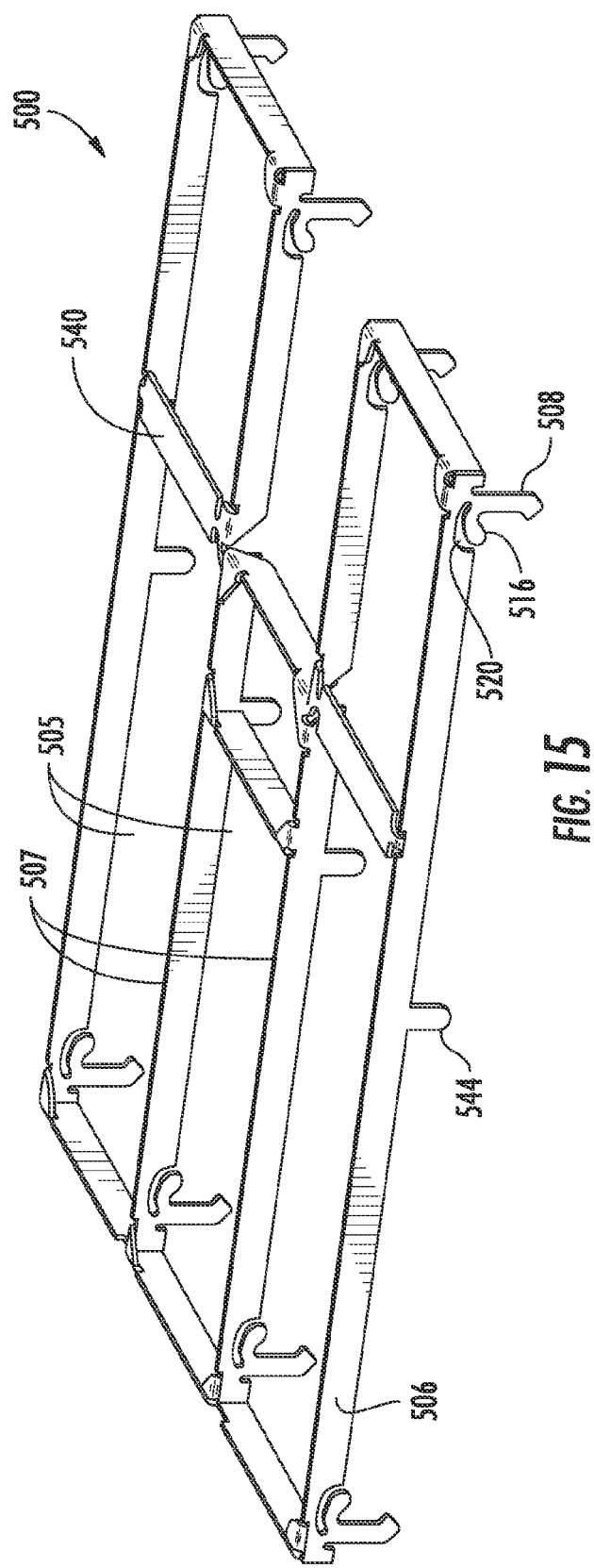

FIG. 14 illustrates the portion of the EMI shielding apparatus shown in FIGS. 12 and 13, and illustrating the latching member in an installed configuration and engaged to the printed circuit board, such that the EMI shielding apparatus is mechanically attached to the printed circuit board; and FIG. 15 is a perspective view of an exemplary embodiment of a frame portion of a two-piece EMI shielding apparatus having latching members insertable into holes in a printed circuit board for engaging the printed circuit board to mechanically attach the shielding apparatus to the printed circuit board.

DETAILED DESCRIPTION

Example embodiments will now be described more fully with reference to the accompanying drawings.

It is common to solder a board level shield (BLS) to a printed circuit board (PCB). For a good solder joint to form between the BLS and the PCB, there must be adequate contact to the solder paste prior and during reflow operations. The inventor hereof, however, has found that adequate contact is sometimes not achieved due to reasons such as part flatness, twist, PCB flatness and tolerances, and dynamic movement during heating. In addition, the inventor hereof has further recognized that there are some types of unique BLS applications (e.g., a BLS with a thermal interface material (TIM) installed between a thermally active component and the BLS) that have intended interference (for thermal reasons) that make it difficult or impractical to fixture the BLS to the PCB for solder reflow. For these BLS/thermal applications, the inventor has recognized that it generally will not work well to simply use the typical BLS solder applications in which the BLS is weighted or fixtured in place for the solder re-flow operation to ensure adequate contact to the solder paste on the PCB trace and ensure good solder joints are achieved.

Accordingly, the inventor has disclosed herein exemplary embodiments incorporating design features on single piece BLS shields, frame portions of two piece BLS shields, etc. that contain through-hole locking or latching mechanisms, which may be integral to the side walls of the shield or frame. These design features can be applied in multiples as required by the application and will mechanically attach or connect the BLS to the PCB. This latching can possibly be a final step in the BLS assembly, or can simply aid in securing the BLS part during additional processing such as solder reflow.

In some exemplary embodiments, sheet metal design features may be incorporated into typical existing designs for board level shields, such as into the side wall of the BLS. These features may include thru-hole type features such as protruding legs or latching members that extend at least partially into or through holes, openings, apertures, notches, cutouts, etc. in the PCB. These thru-hole features will align to defined PCB hole patterns (e.g., thru-holes, blind holes that do not extend completely through the PCB, notches, etc.) and may be configured to extend only partially through or completely through the holes in the PCB. The protruding legs/latching members will locate or align the BLS, frame, or part to the PCB, while a contact, cam, or actuator member initially creates a stand-off relative to the final position. When the contact member is compressed, the protruding legs or latching members (through the PCB) are caused to move, rotate, or pivot (e.g., inwards towards each other in some embodiments) within the plane of the side wall. The final position of the end portions or feet of the protruding legs/latching members are such that they grip or frictionally engage the underside of the PCB (or the inner sidewalls within the holes in some embodiments) thereby mechanically attaching (e.g., latching, locking, etc.) the BLS to the PCB. In applications where the PCB is of sufficient thickness, the end portions/feet of the protruding legs/latching members may be configured to grasp or frictionally engage the side walls of the hole in the PCB, thereby eliminating any portion of the BLS from extending below the bottom surface of the PCB.

Accordingly, exemplary embodiments may provide a relatively simple way to mechanically attach a BLS to a PCB, improved part interface to PCB, and/or fixturing/installation method for solder reflow. In addition, the pivotal or rotational movement of the protruding legs/latching members to engage the PCB is within the plane of the corresponding side wall(s) of the BLS. Thus, the attachment via the protruding legs/latching members is within the plane of the corresponding sidewall(s), which improves manufacturing simplicity. The attachment also remains within the footprint of the BLS, which allows for a smaller installation space as compared to a scenario where the attachment is outside the footprint and would require additional room for installation of the BLS.

The engagement of the one or more latching members with the substrate may improve co-planarity with respect to the BLS or other EMI shielding part, frame, etc. mating to the substrate prior to soldering of the shielding apparatus to the substrate. Co-planarity is concerned with the mating of the shield to the PCB. The better the mate, the thinner the solder paste can be. For relatively large and delicate shields, it can be very difficult to achieve a very flat part in it's free state. But with the inventor's thru-hole latching mechanism, a part can easily be fixtured or attached to a PCB for either post solder reflow. For example, exemplary embodiments are disclosed that include latching members configured to be operable to not only hold the BLS, frame, part, etc. in place during solder reflow, but also to help establish, maintain, or ensure good/close contact or co-planarity between the BLS and PCB, thus allowing for formation of a good solder joint. With the improved co-planarity, the minimum solder paste thickness may be reduced, thus allowing the BLS to be soldered to the PCB using less solder.

In some exemplary embodiments, the latching members may be operable to hold a BLS, frame, part, etc. in place while also acting as a primary electrical conductive path to the PCB ground plane. In these latter applications, there may be no soldering post installation and the latching members (e.g., pins, etc.) may be electrically, galvanically connected to the PCB ground plane.

In exemplary embodiments, the engagement of the latching members/protruding legs with the PCB may provide a relatively high retention force (e.g., one to four pounds for each latching member, etc.) such that the shielding apparatus is not readily removable from the PCB. In other exemplary embodiments, however, the shielding apparatus may be configured to be removable and reattachable back onto the board. For example, the shielding apparatus may be removed to allow for testing, repair, and/or replacement of the electronic components on the PCB.

The thru-hole features (latching members/protruding legs, contact members) of the present disclosure may be used with a wide range of differently configured, sized, shaped, etc. EMI shielding apparatus. By way of example only, exemplary embodiments of an EMI shielding apparatus disclosed herein may be dimensionally sized to range from about 0.50 inches (~1.27 centimeters) to about 8 inches (~20.32 centimeters) in width and/or length, and/or have a wall thickness of about 0.2 millimeter. These dimensions provided herein are for purposes of illustration only, as an EMI shielding apparatus may be sized differently with larger or smaller dimensions depending, for example, on the particular application, such as the components to be shielded, space considerations within the overall device, EMI shielding and heat dissipation needs, and other factors.

A non-exhaustive list will now be provided of exemplary materials from which an EMI shielding apparatus having one or more latching members may be made. Exemplary materials include cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, an EMI shielding apparatus may be formed from a plastic material coated with electrically-conductive material. In one exemplary embodiment, an EMI shielding apparatus is from a sheet of cold rolled steel having a thickness of about 0.20 millimeters. The materials provided herein are for purposes of illustration only, as an EMI shielding apparatus may be configured from different materials depending, for example, on the particular application, such as the components to be shielded, space considerations within the overall device, EMI shielding and heat dissipation needs, and other factors.

Figure 1:
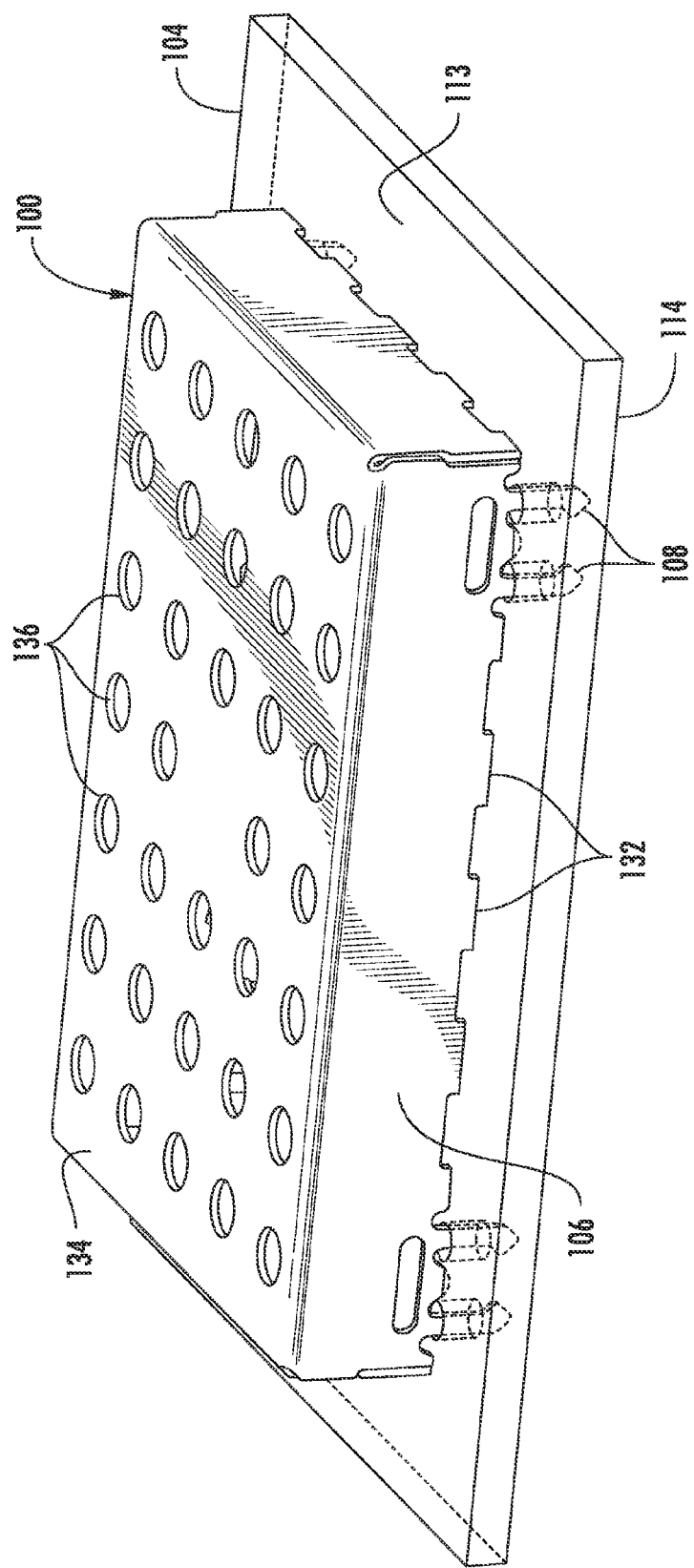
FIG. 1 is a perspective view of an EMI shielding apparatus having latching members inserted into thru-holes in a printed circuit board for locking or latching under an underside of the printed circuit board, according to an exemplary embodiment of the present disclosure.
Figure 2:
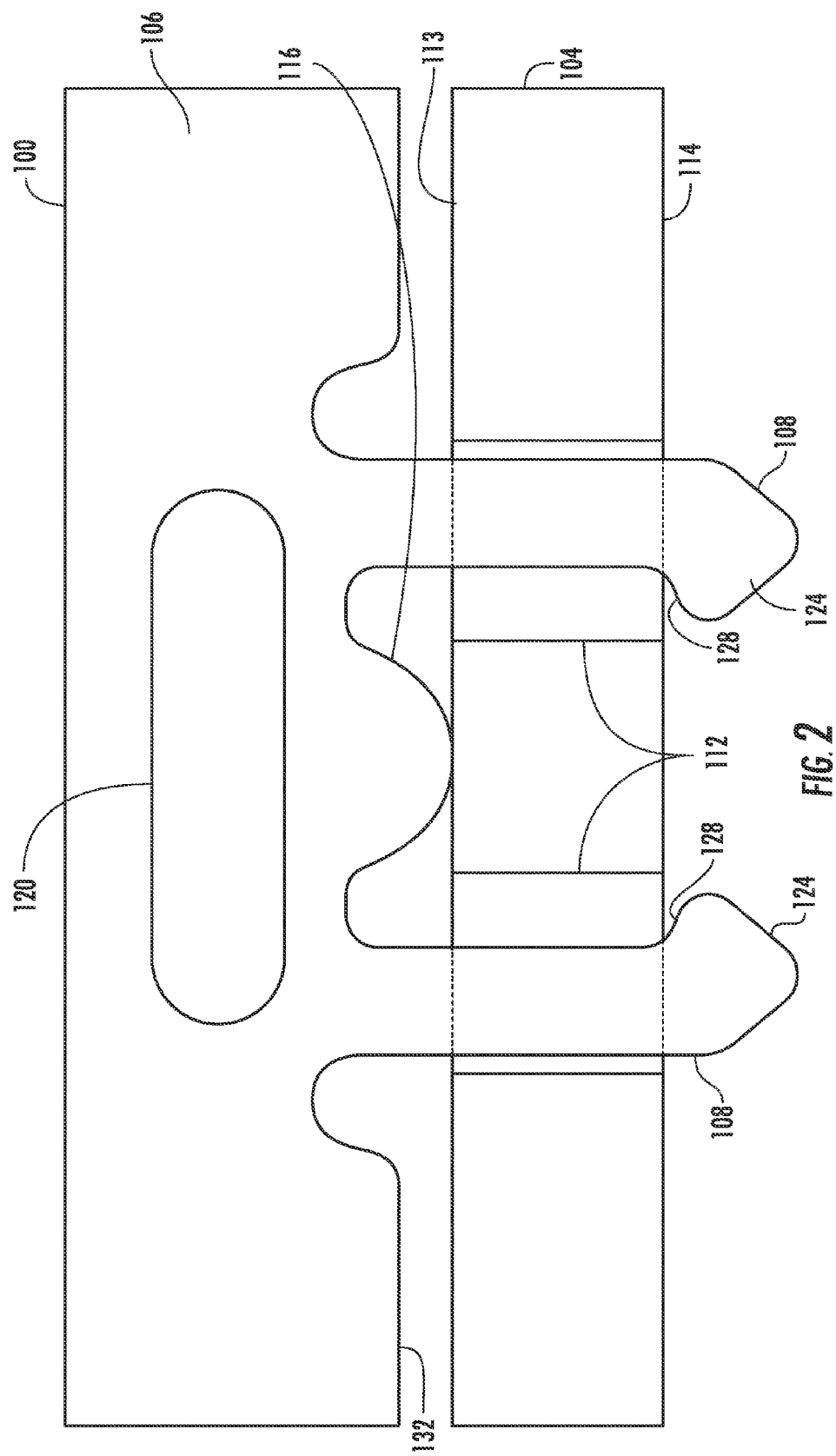
FIG. 2 is a partial view of the EMI shielding apparatus shown in FIG. 1 positioned on the printed circuit board, and also illustrating the latching members inserted into the thru-holes in a pre-installed configuration prior to engagement with the printed circuit board.
Figure 3:
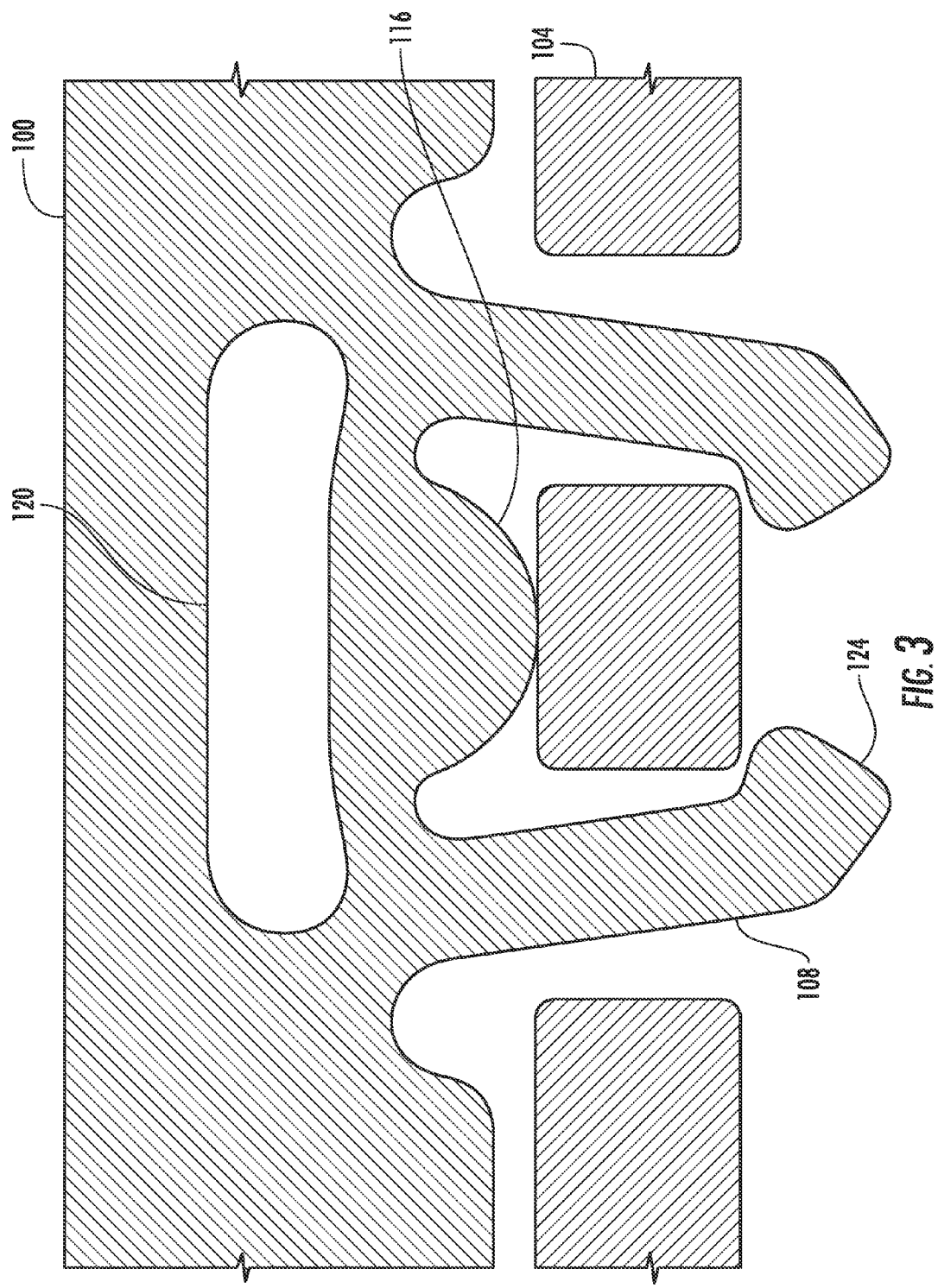
FIG. 3 illustrates the portion of the EMI shielding apparatus shown in FIG. 2 wherein a force is compressing the EMI shielding apparatus downwardly onto or toward the printed circuit board such that the latching members have been moved from the pre-installed configuration to an intermediate configuration.
Figure 4:
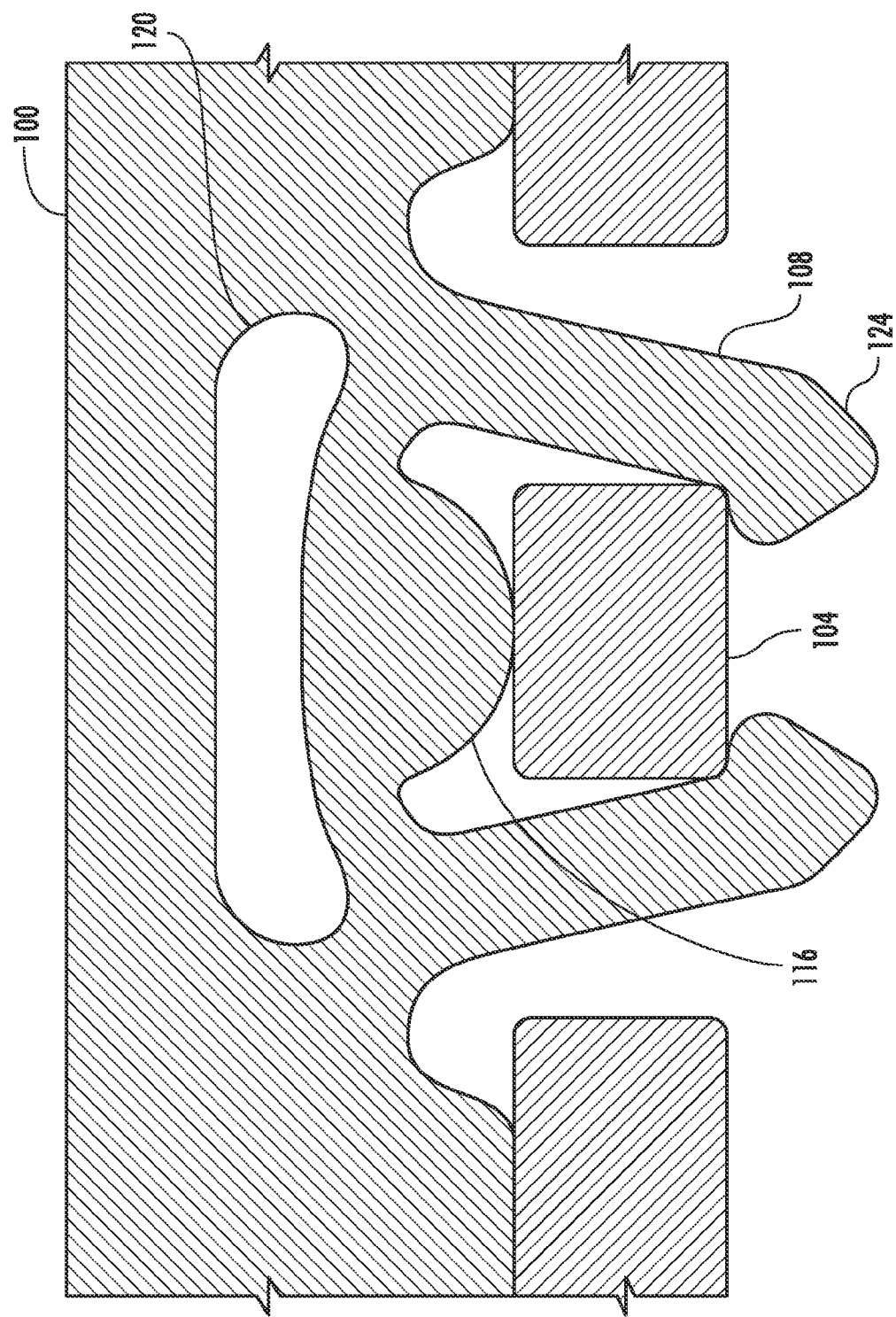
FIG. 4 illustrates the portion of the EMI shielding apparatus shown in FIGS. 2 and 3, wherein the latching members are shown in an installed configuration and engaged to the printed circuit board, such that the EMI shielding apparatus is mechanically attached to the printed circuit board.
Figure 5:
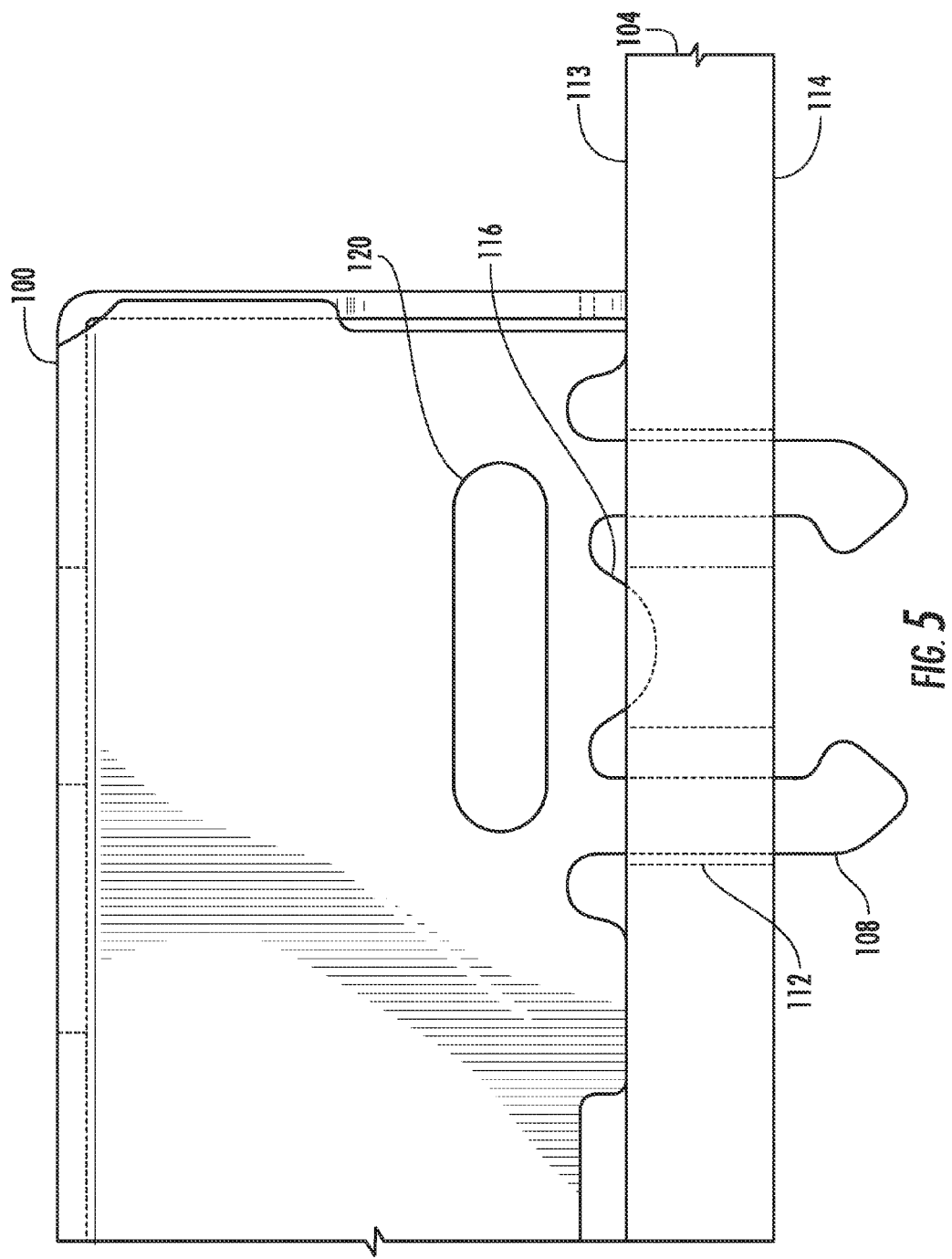
FIG. 5 illustrates the extent of over-travel of the contact member and the latching members relative to the topside and holes, respectively, of the printed circuit board.
Figure 6:
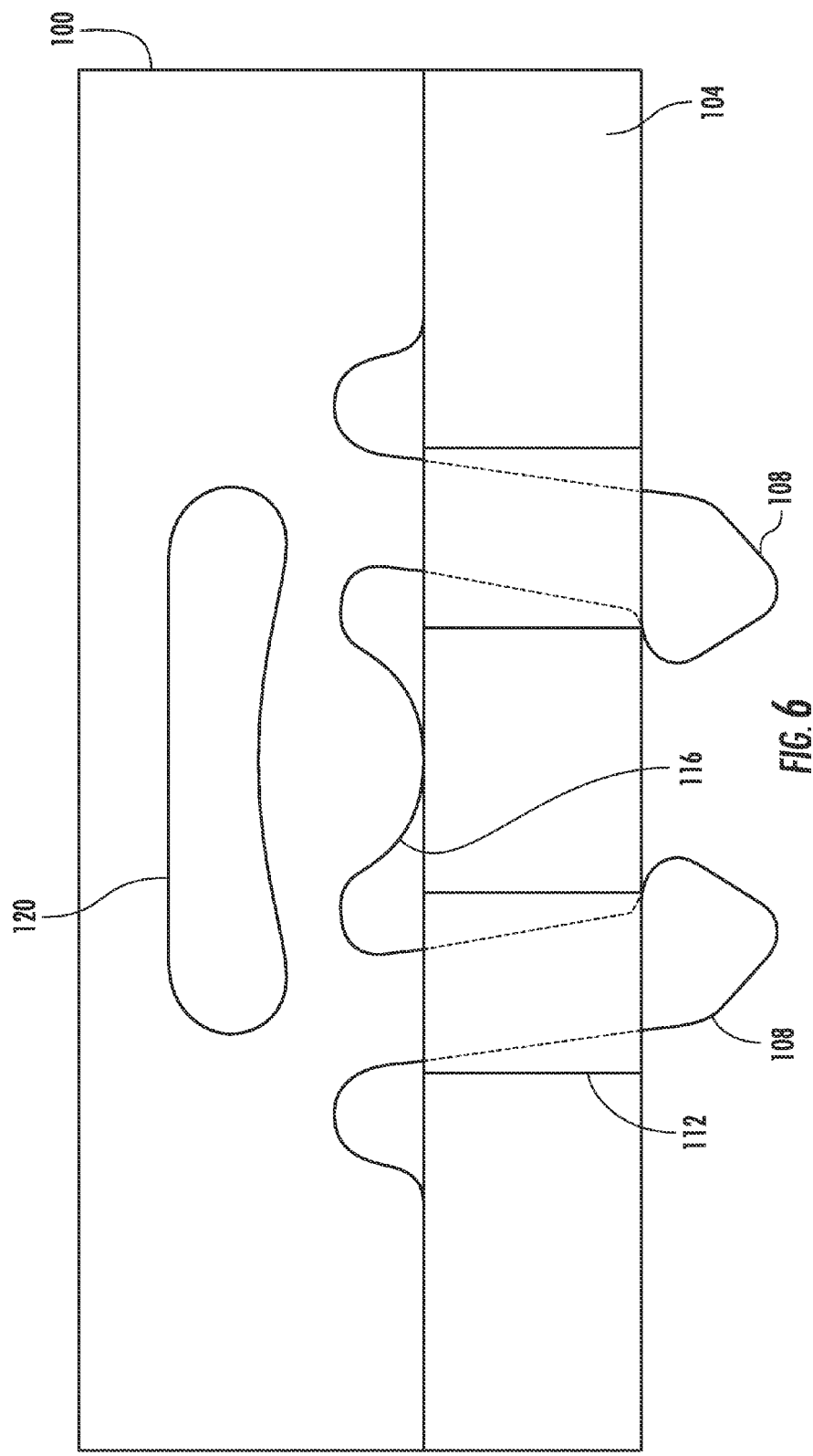
FIG. 6 illustrates the portion of the EMI shielding apparatus shown in FIG. 4 mechanically attached by the latching members to a printed circuit board having smaller diameter holes.

Referring now to the drawings, FIGS. 1 through 6 illustrate an exemplary embodiment of a shielding apparatus or shield 100 embodying one or more aspects of the present disclosure. As shown in FIGS. 1, 4, and 6, the shielding apparatus 100 may be installed to a printed circuit board 104 (a PCB, and broadly a substrate) and is suitable for use in providing electromagnetic interference (EMI) shielding to one or more components mounted on the PCB 104.

Figure 11:
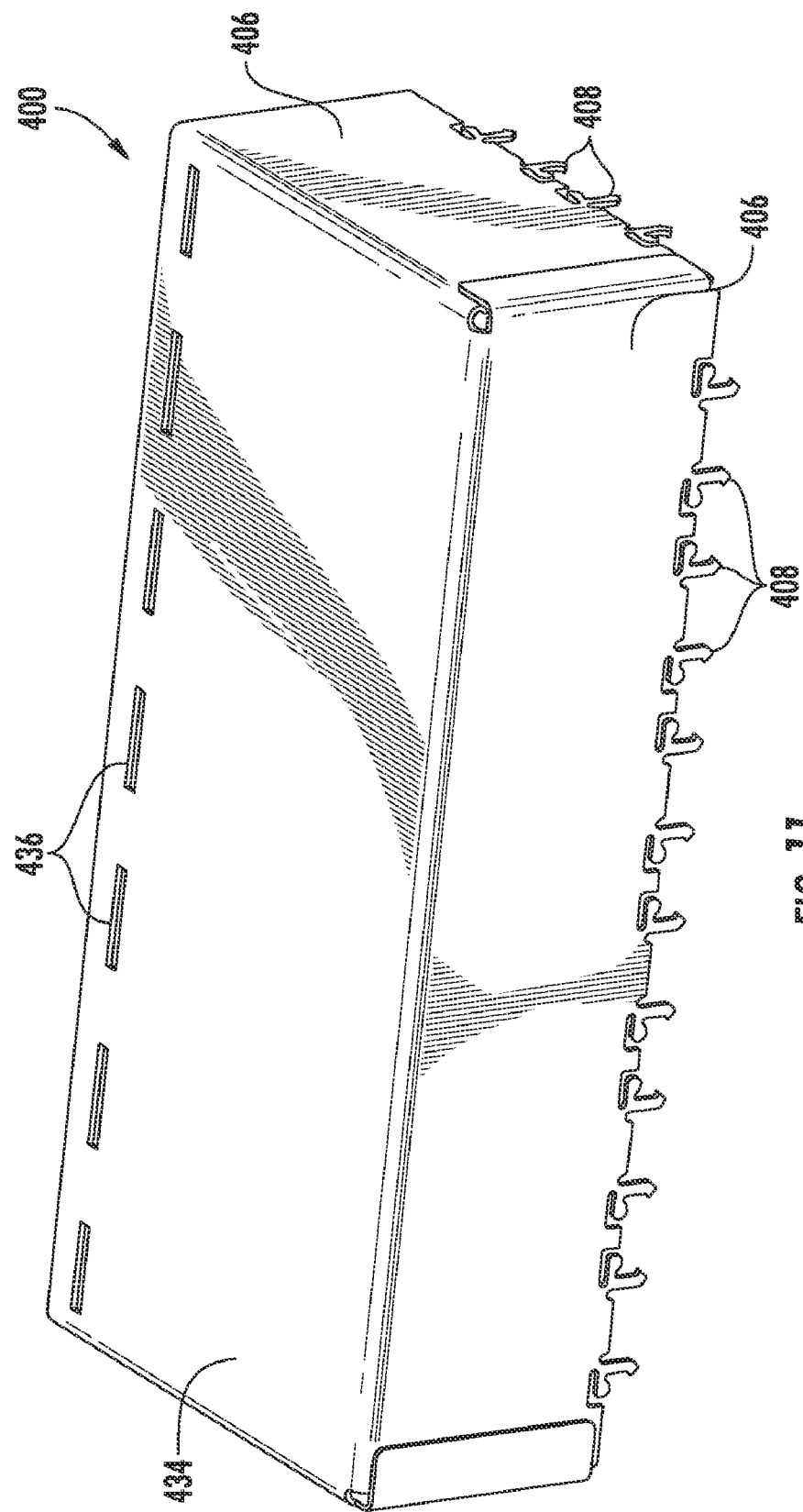
FIG. 11 is a perspective view of another exemplary embodiment of an EMI shielding apparatus having latching members insertable into holes in a printed circuit board for engaging the printed circuit board to mechanically attach the shielding apparatus to the printed circuit board.

The shield 100 generally includes sidewalls 106 and latching members or protruding legs 108 integrally formed or defined by the longer of the two sidewalls 106. Alternative embodiments may have latching members along more or less than two sidewalls, etc. For example, FIG. 11 illustrates an exemplary shield 400 (described below) having latching members 408 along each of its four sidewalls 406.

As shown in FIG. 2, the latching members 108 protrude vertically downward from the sidewalls 106 and are insertable into holes 112 in the PCB 104. FIG. 2 illustrates the latching members 108 in a pre-installed configuration.

After being inserted into the holes 112, the latching members 108 may be caused to move relative to the corresponding sidewall 106 and PCB 104 into an installed configuration (FIGS. 4 and 6). In this exemplary embodiment, the latching members 108 are configured to be moved from the pre-installed configuration (FIG. 2) into the installed configuration (FIGS. 4 and 6) while remaining substantially within the same plane as the corresponding sidewall 106 from which they depend. FIG. 5 illustrates the latching members 108 in an intermediate configuration as the latching members 108 are transitioning from the pre-installed configuration (vertical orientation shown in FIG. 2) to the installed configuration (slanted orientation gripping or latching under the PCB 104 shown in FIGS. 4 and 6).

The latching members 108 may be caused to transition from the pre-installed configuration to the installed configuration when a sufficient force is applied for compressing the shield 100 downwardly onto or toward the PCB 104. The latching members 108 may be caused or forced to move from the pre-installed configuration to the installed configuration by relative movement of the shield 100 onto the PCB 104 and subsequent application of force compressing the shield 100 against the PCB 104. In this exemplary embodiment, the latching members 108 may be inserted into the holes 112 and caused to move to the installed configuration by movement and application of force in the direction parallel to the direction of insertion of the latching members 108 into the holes 112.

With continued reference to FIG. 2, a contact, cam, or actuator member 116 is disposed between each pair of generally oppositely facing latching members 108. In this example, the contact member 116 is semicircular, although other configurations are possible.

As shown in FIG. 2, the contact member 116 initially creates a stand-off relative to the final position shown in FIGS. 4 and 6. When the contact member 116 is compressed (as shown by a comparison of FIGS. 2, 3, and 4), the latching members 108 are caused to move, rotate, or pivot inwards towards each other within the plane of the side wall 106 to grip or frictionally engage the underside 114 of the PCB 104 therebetween. FIG. 5 illustrates the extent of over-travel of the contact member 116 and the latching members 108 relative to the topside 113 and holes 112, respectively, of the PCB 104.

The contact member 116 is configured to contact the PCB 104 and move in a direction generally away from the PCB 104 in response to a force applied to the shield 100 in a direction generally toward the PCB 104. This movement of the contact member 116 reconfigures, actuates, or causes the transitioning of the latching members 108 from the pre-installed configuration (vertical orientation) to the installed configuration (slanted or inwardly rotated orientation) as shown by the progression of FIGS. 2, 3, and 4.

As shown in FIG. 2, the contact member 116 includes a first configuration when the latching members 108 are in the pre-installed configuration and disengaged from the PC 104. But the contact member 116 has a second configuration when the latching members 108 are in the installed configuration and engaged with the PCB 104. The movement or flexing of the contact member 116 from the first configuration into the second configuration may generate a clamping force that is applied to the PCB 104 generally between the contact member 116 and the latching members 108.

The shield 100 also includes openings 120 to accommodate movement of the contact members 116 and latching members 108. Each opening 120 is above a corresponding contact member 116 to accommodate movement of the contact member 116 in the direction generally away from the PCB 104. As shown by FIGS. 2 and 4, upward movement of the contact member 116 due to compressive contact with the topside 113 of the PCB 104 causes the height or thickness of the opening 120 thereabove to decrease. In this example, the openings 120 are generally oval-shaped when the latching members 108 are in the pre-installed configuration. Alternative embodiments may include differently configured openings (e.g., different shapes, sizes, locations, etc.).

Figure 7:
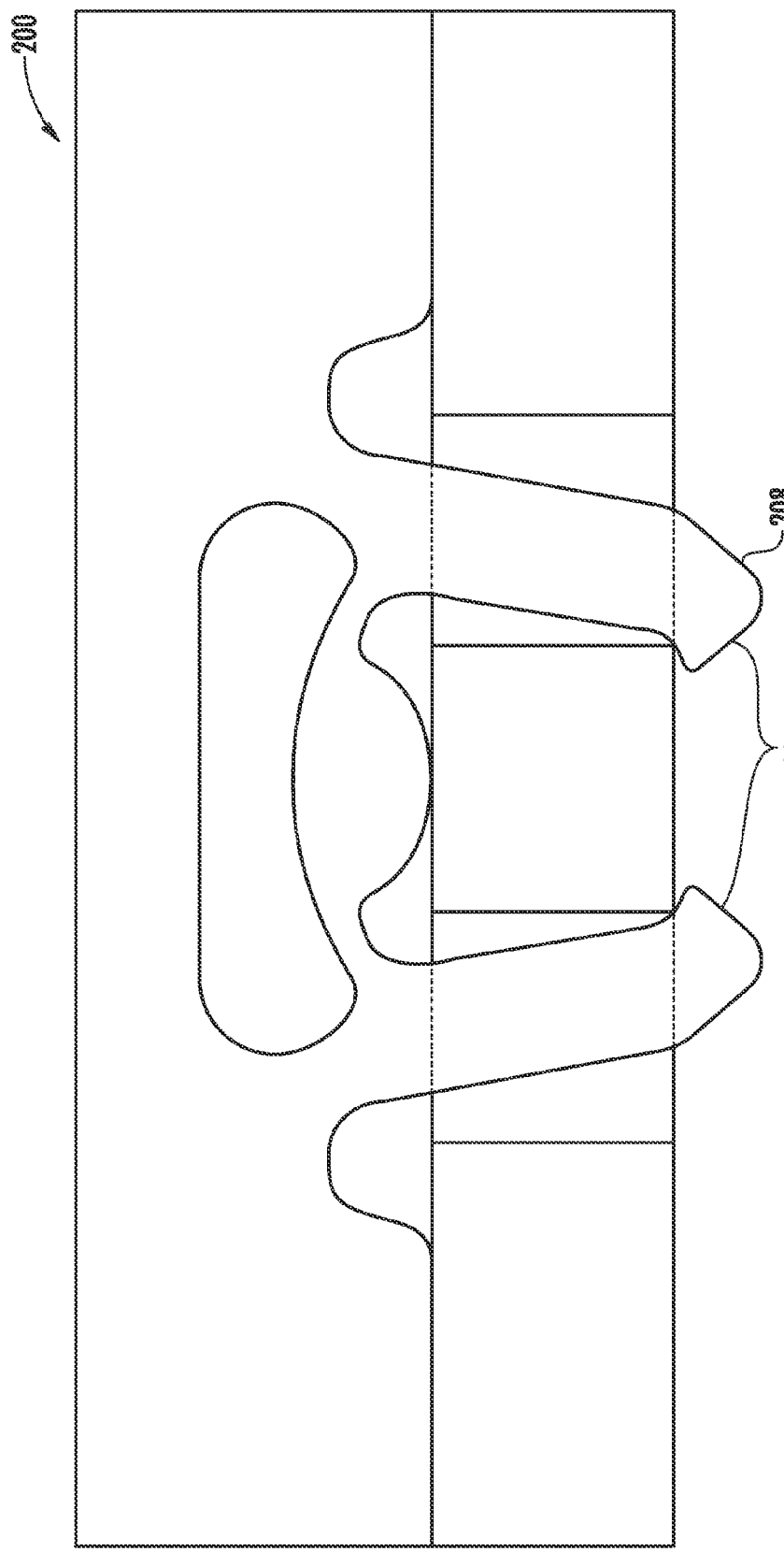
FIG. 7 is a partial view of another exemplary embodiment of a EMI shielding apparatus having differently configured latching members by which the EMI shielding apparatus is mechanically attached to the printed circuit board.

The latching members 108 include end portions 124 configured for engaging the PCB 104. In this example embodiment, the latching members 108 include latching surfaces 128 configured to be latched under the underside 114 of the PCB 104 as shown in FIGS. 4 and 6. Alternative embodiments may include latching members having differently configured end portions (e.g., U-shaped, L-shaped, hook-shaped, etc.) for engaging the underside of a substrate. For example, FIG. 7 illustrates another exemplary embodiment of an EMI shielding apparatus 200 having latching members 208 with end portions 224 differently shaped than the end portions 124 of the latching members 108 shown in FIG. 2.

With continued reference to FIG. 1, the holes 112 in the PCB 104 are illustrated as circular thru-holes that extend completely through the PCB 104 from the topside 113 to the underside 114 of the PCB 104. Alternative configurations are also possible for the holes 112 in other embodiments, such as blind holes or openings that do not extend completely through the PCB 104, differently shaped apertures, notches, cutouts, etc. Preferably, the holes 112 in the PCB 104 are located such that insertion of the latching members 108 into the holes 112 properly locates or aligns the shield 100 relative to the PCB 104.

In exemplary embodiments, the latching members 108 are configured to be operable to not only hold the shield 100 in place during solder reflow, but also the latching member 108 help establish, maintain, or ensure good/close contact or co-planarity between the shield 100 and PCB 104. This allows for the formation of a good solder joint. With the improved co-planarity, the minimum solder paste thickness may be reduced, thus allowing the shield 100 to be soldered to the PCB 104 using less solder.

In alternative embodiments, the latching members 108 may be operable to hold the shield 100 in place while also acting as a primary electrical conductive path to a ground plane of the PCB 104. In this example, there may be no soldering post installation and the latching members 108 may be electrically, galvanically connected to the PCB ground plane. Also in this example, the latching members 108 may be configured to engage the PCB 104 such that the shield 100 is securely retained to the PCB 104, without any need for further securement, welding, or mechanical fastening of the shield 100 to the PCB 104.

The shield 100 (and/or other shields disclosed herein) may be formed from a single piece of electrically-conductive material (e.g., single blank of material, etc.) so that the side walls 106, latching members 108, and contact member 116 have an integral, monolithic construction. A wide range of electrically-conductive materials may be used to form the shield 100, such as those disclosed above. In the illustrated embodiment, the latching members 108 and contact members 116 may be formed from resilient or compliant material to allow the latching members 108 to move inwardly towards each other while generally remaining within the same plane as the sidewall 106 from which they depend.

In one exemplary embodiment, a flat profile pattern for the shield 100 (and/or other shields disclosed herein) may be stamped into a piece of material. The flat profile pattern may include the sidewalls 106, latching members 108, contact members 116, and openings 120. The flat profile pattern may also include mounting feet 132 for soldering the shield 100 to the PCB 104. The shield's sidewalls 106 may then be formed, bent, drawn, shaped, folded, etc. into the configuration shown in FIG. 1 through 3 (e.g., sidewalls 106 and latching members 108 generally perpendicular to the shield's top surface or cover 134, etc.). Even though the shield 100 may be formed (e.g., stamping and bending/folding/drawing, etc.) from the same piece of material substantially simultaneously in this example, such is not required for all embodiments. For example, other embodiments may include one or more discrete components separately attached to the shield 100, for example, by welding, adhesives, among other suitable methods. Alternative configurations (e.g., shapes, sizes, etc.), materials, and manufacturing methods may be used for making the shield 100. In addition, the shield 100 is illustrated as a single piece shield that is operable for shielding one or more components on the PCB 104 that are within an interior cooperatively defined by the shield's sidewalls 106 and top surface 134. But other embodiments include multi-piece shields, see, for example, the frame 500 shown in FIG. 15 and described below.

In the example embodiment shown in FIG. 1, the shield 100 includes four sidewalls 106 providing a generally rectangular shape. In other exemplary embodiments, shields may include more than or fewer than four sidewalls and/or in a configuration different from that shown in the figures herein. For example, the shield may have square configurations, triangular configurations, hexagonal configurations, other polygonal-shaped configurations, circular configurations, non-rectangular configurations, etc.

As shown in FIG. 1, the shield 100 includes mounting feet 132 for contacting one or more components of the PCB 104 to establish or provide for electrical contact with the PCB 104. The mounting feet 132 are formed as an integral part of the shield 100.

While the mounting feet 132 may be soldered to the PCB 104, the shield 100 need not be soldered to the PCB 104 in all embodiments. In one exemplary embodiment, the mounting feet 132 may be soldered to grounded traces positioned on the PCB substrate and/or around the electrical circuits generating (or requiring protection from) electromagnetic interference as well as around the electrical circuits that are susceptible to interference The shield's upper surface 134 includes apertures or holes 136 (FIG. 1), which may facilitate solder reflow heating interiorly of the shield 100, may enable cooling of the electrical components within the shield 100, and/or may permit visual inspection of members of the electrical components 105 beneath the shield 1000. In some exemplary embodiments, shields may include holes that are sufficiently small to inhibit passage of interfering EMI. The particular number, size, shape, orientation, etc. of the holes may vary depending, for example, on the particular application (e.g., sensitivity of the electronics where more sensitive circuitry may necessitate the use of smaller diameter holes, etc.). For example, some exemplary shields may include covers without any such holes.

The shield 100 (or any other shield disclosed herein) may also include a generally central pick-up surface configured for use in handling the shield with pick-and-place equipment (e.g., vacuum pick-and-place equipment, etc.). The pick-up surface may be configured for use as a pick-up area that may be gripped or to which suction may be applied by the pick-and-place equipment for handling during, for example, fabrication of the shield 100 and/or original installation of the shield 100 to the PCB 104. The pick-up surface may allow for balanced manipulation of the shield 100 during handling of the shield 100. In other exemplary embodiments, a shield may include tabs at corners and/or along side edges for use as pick-up surfaces in addition to or instead of centrally located pick-up surfaces.

By way of example only, a description will now be provided of an exemplary method by which the shield 100 may be attached to the PCB 104. The shield 100 may be placed on the PCB 104 such that the latching members 108 are inserted into the holes 112 in the PCB 104. A force may then be applied for causing the latching members 108 to move from their pre-installed configuration to their installed configuration. For example, an installer may place a finger against the upper surface 134 of the shield 100 and press downwardly with sufficient force to cause the latching members 108 to move from their pre-installed configuration to their installed configuration. Accordingly, the shield 100 is thus mechanically attached to the PCB 104. In some exemplary embodiments, the shield 100 may then also be soldered to the PCB 104. Alternatively, other manual methods or automatic methods (e.g., pick and place equipment, etc.) may be used for attaching the shield 100 to the PCB 104.

Figure 8:
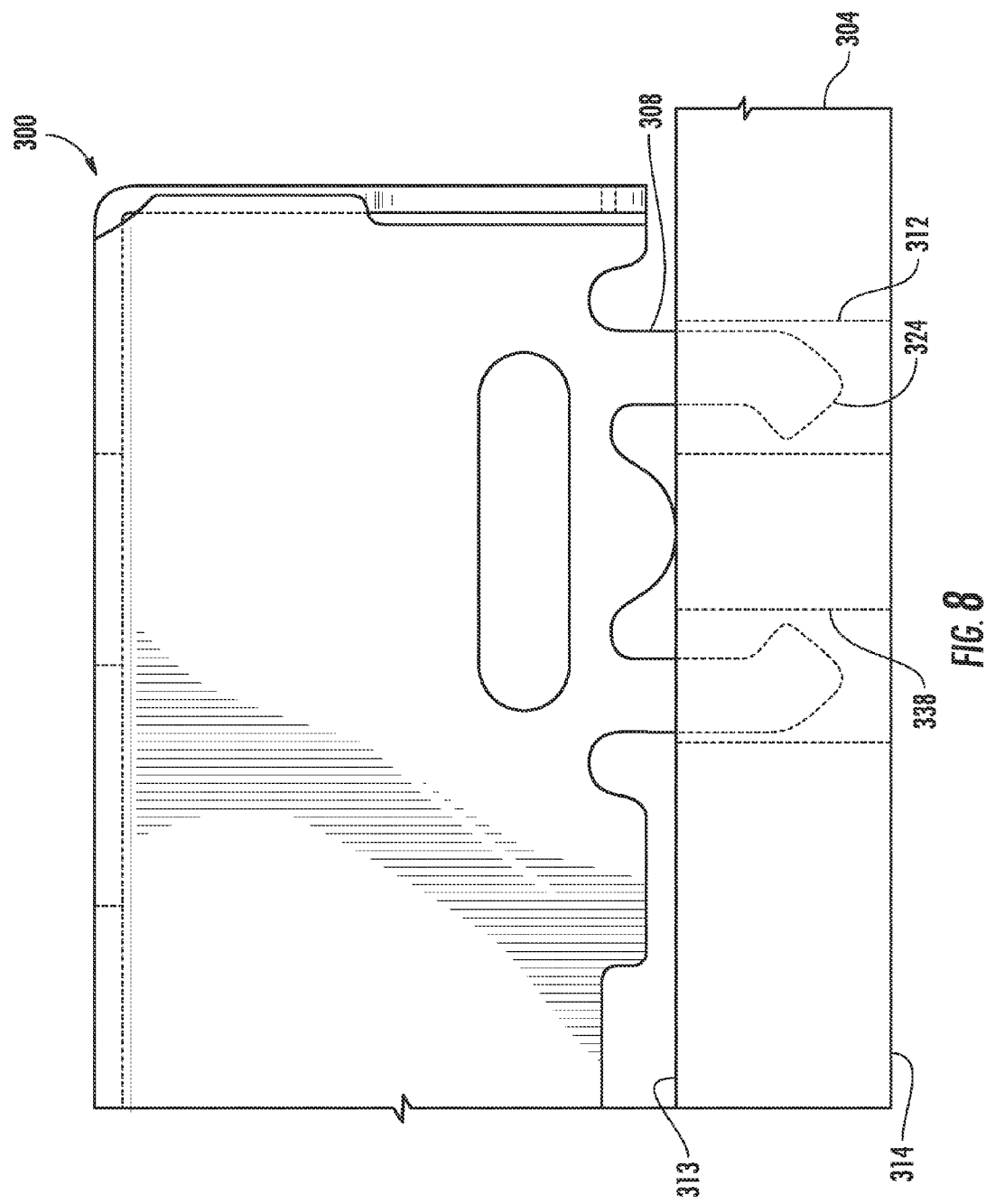
FIG. 8 is a partial view of another exemplary embodiment of a EMI shielding apparatus in which the latching members do not extend completely through the holes in the printed circuit board.
Figure 9:
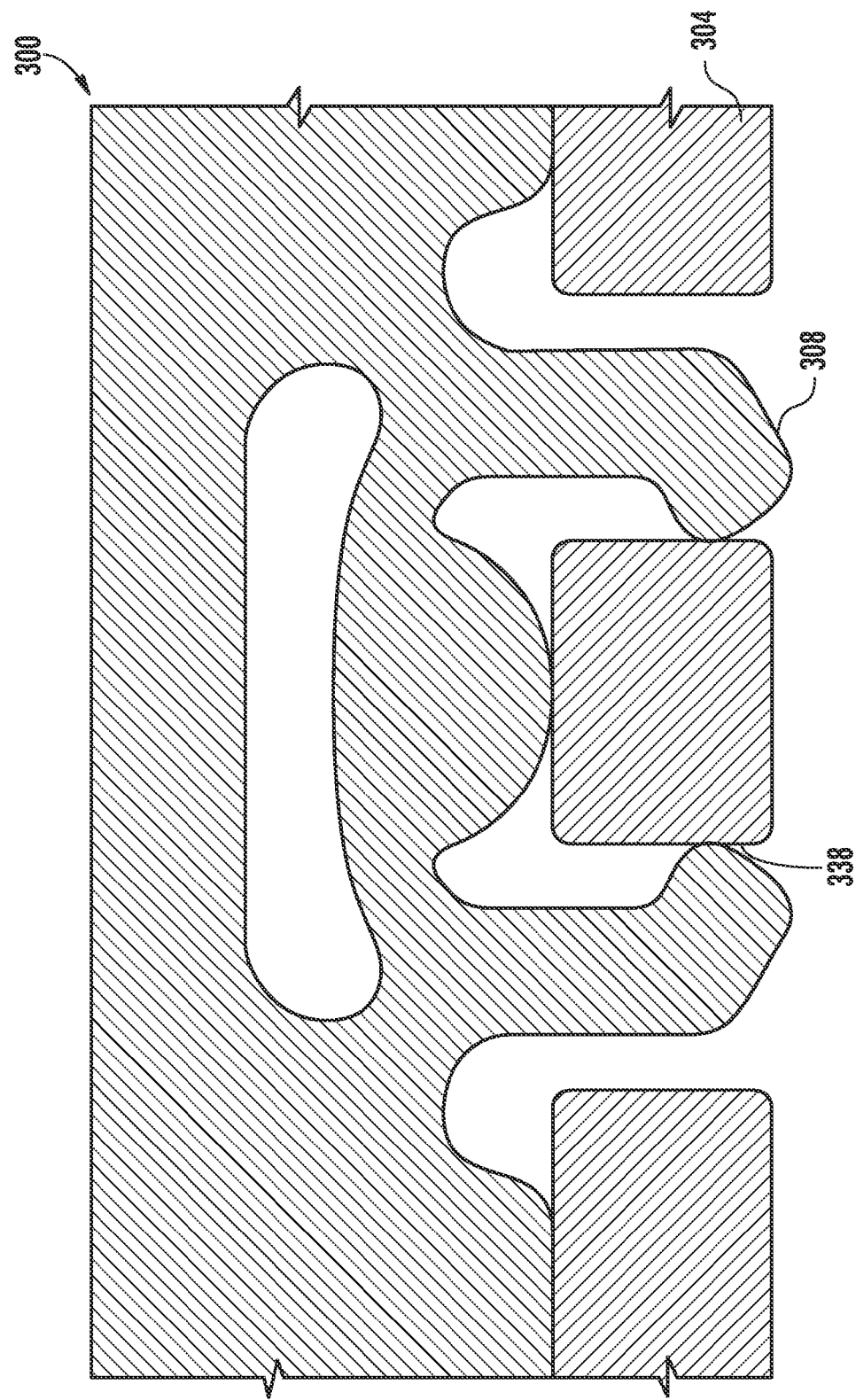
FIG. 9 illustrates the portion of the EMI shielding apparatus shown in FIG. 8 mechanically attached to the printed circuit board by the latching members, which are shown in an installed configuration and engaged to the printed circuit board.
Figure 10:
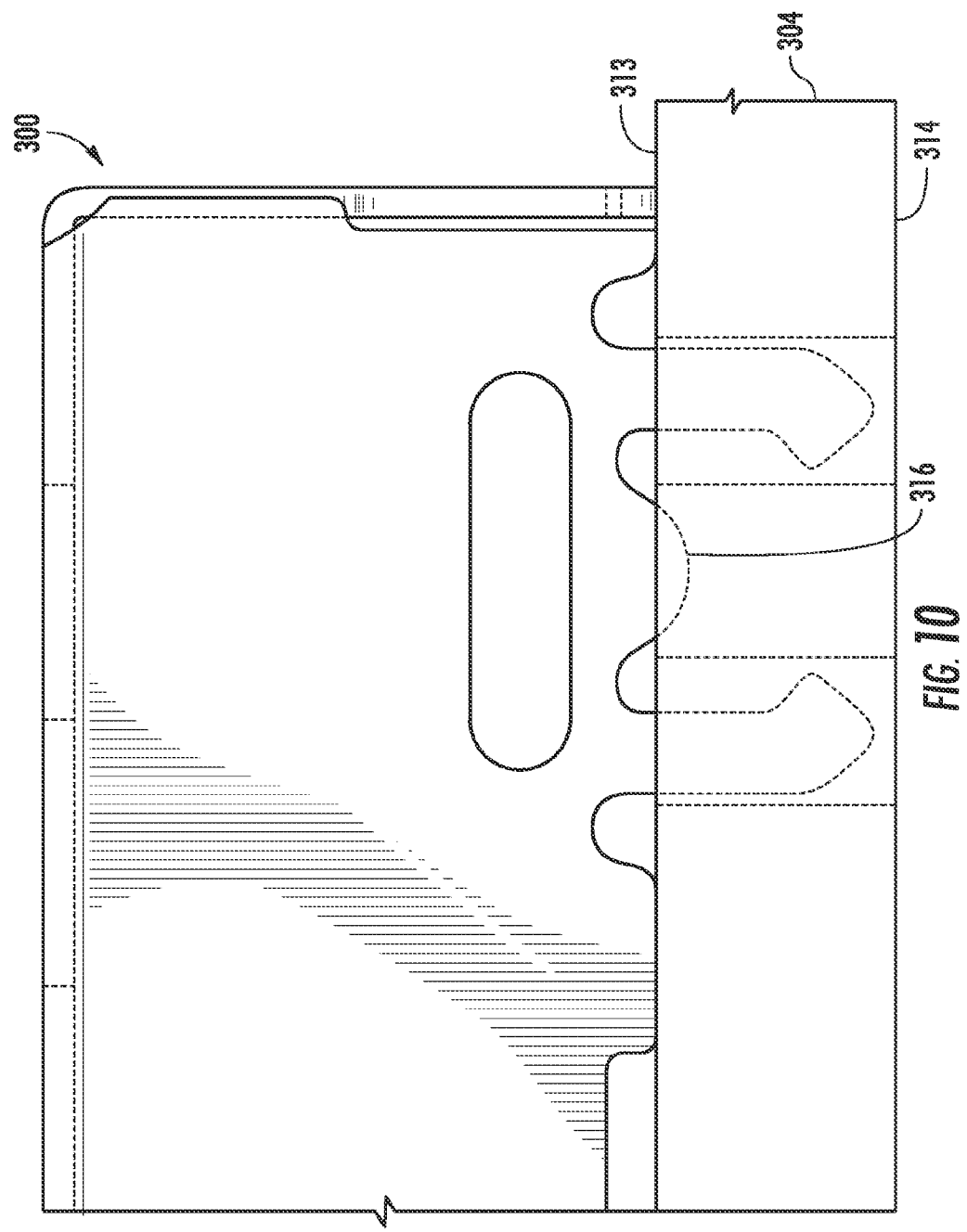
FIG. 10 illustrates the extent of over-travel of the contact member relative to the topside of the printed circuit board.

FIGS. 8 through 10 illustrate another exemplary embodiment of a shielding apparatus or shield 300 embodying one or more aspects of the present disclosure. As shown in FIG. 8, the latching members 308 do not extend completely through the holes 312 in the PCB 304. The latching members 308 may be caused to move from a pre-installed configuration (FIG. 8) to an installed configuration (FIG. 9) in a similar manner as that disclosed above for the shield 100. In the installed configuration, the latching members 308 are engaged with the PCB 304 such that the shield 300 is mechanically attached to the PCB 304. FIG. 10 illustrates the extent of over-travel of the contact member 316 relative to the topside 313 of the PCB 304.

In this example embodiment, the latching member 308 have a length less than the thickness of the PCB 304 such that the end portions or feet 324 of the latching members 308 are not insertable completely through the PCB 304. The latching members 308 are configured to extend into the holes 312 a distance less than the depth of the holes 312. Accordingly, the end portions 324 of the latching members 308 do not penetrate completely through the holes 312 and are confined therein, such that no part of the latching members 308 protrude or extend out of the holes 312 below the underside 314 of the PCB 304. The end portions 324 of the latching members 308 are frictionally engagable with corresponding inner sidewall portions 338 within the holes 312 to mechanically attach the shield 300 to the PCB 304.

FIGS. 11 through 14 illustrate another exemplary embodiment of a shielding apparatus or shield 400 embodying one or more aspects of the present disclosure. As shown in FIG. 14, the shielding apparatus 400 may be installed to a printed circuit board 404 (a PCB, and broadly a substrate) and is suitable for use in providing electromagnetic interference (EMI) shielding to one or more components mounted on the PCB 404.

The shield 400 generally includes sidewalls 406 and latching members or protruding legs 408 integrally formed or defined by the sidewalls 406. As shown in FIG. 11, the latching members 408 protrude vertically downward from each of the sidewalls 406 and are insertable into holes 412 in the PCB 404, as shown in FIG. 12 illustrating one of the latching members 408 in a pre-installed configuration and inserted into a hole 412 of the PCB 404. Alternative embodiments may have latching members along less all sidewalls, as is the case for the exemplary shield 100 illustrated in FIG. 1. Preferably, the holes 412 in the PCB 404 and latching members 408 are located such that insertion of the latching members 408 into the holes 412 properly locates or aligns the shield 400 relative to the PCB 404.

As shown by FIGS. 12, 13, and 14, the latching members 408 may be caused to move relative to the corresponding sidewall 406, PCB 404, and holes 412 from the pre-installed configuration into an installed configuration (FIG. 14). In this exemplary embodiment, the latching members 408 are configured to be moved from the pre-installed configuration (FIG. 12) into the installed configuration (FIG. 14) while remaining substantially within the same plane as the corresponding sidewall 406 from which they depend. FIG. 13 illustrates a latching member 408 in an intermediate configuration as the latching member 408 transitions from the pre-installed configuration (vertical orientation shown in FIG. 12) to the installed configuration (slanted orientation frictionally engaging or latching under the PCB 404 shown in FIG. 14).

The latching members 408 may be caused to transition from the pre-installed configuration to the installed configuration when a sufficient force is applied for compressing the shield 400 downwardly onto or toward the PCB 404. The latching members 408 may be caused or forced to move from the pre-installed configuration to the installed configuration by relative movement of the shield 400 onto the PCB 404 and subsequent application of force compressing the shield 400 against the PCB 404. In this exemplary embodiment, the latching members 408 may be inserted into the holes 412 and caused to move to the installed configuration by movement and application of force in the direction parallel to the direction of insertion of the latching members 408 into the holes 412.

With continued reference to FIG. 12, a contact, cam, or actuator member 416 is disposed adjacent or integral to each latching member 408. The contact member 416 initially creates a stand-off relative to the final position shown in FIG. 14. When the contact member 416 is compressed (as shown by a comparison of FIGS. 12, 13, and 14), the latching members 408 are caused to move, rotate, or pivot inwards towards to latch under or frictionally engage the underside 414 of the PCB 404.

The contact member 416 is configured to contact the PCB 404 and move in a direction generally away from the PCB 404 in response to a force applied to the shield 400 in a direction generally toward the PCB 404. This movement of the contact member 416 reconfigures, actuates, or causes the transitioning of the latching member 408 from the pre-installed configuration (vertical orientation) to the installed configuration (slanted or inwardly rotated orientation) as shown by the progression of FIGS. 12, 13, and 14.

As shown in FIG. 12, the contact member 416 includes a first configuration when the latching member 408 is in the pre-installed configuration and disengaged from the PCB 404. But the contact member 416 has a second configuration when the latching member 408 is in the installed configuration and engaged with the PCB 404. The movement or flexing of the contact member 416 from the first configuration into the second configuration may generate a clamping force that is applied to the PCB 404 generally between the contact member 416 and the latching member 408.

The shield 400 also includes openings 420 to accommodate movement of the contact members 416 and latching members 408. Each opening 420 is above a corresponding contact member 416 to accommodate movement of the contact member 416 in the direction generally away from the PCB 404. As shown by FIGS. 12 and 14, the contact member 416 rotates or pivots clockwise about the connecting portion 417 and moves upwards into the opening 420 in response to compressive contact with the topside 413 of the PCB 404. In this example, each opening 420 includes an open end and a closed end. Alternative embodiments may include differently configured openings (e.g., different shapes, sizes, locations, etc.). For example, FIG. 1 illustrates an exemplary shield 100 having oval-shaped openings 120 with both ends closed.

With continued reference to FIGS. 12 and 14, the latching members 408 include end portions 424 configured for engaging the PCB 404. In this example embodiment, the latching members 408 include latching surfaces 428 configured to be latched under the underside 414 of the PCB 404 as shown in FIG. 14. Alternative embodiments may include latching members having differently configured end portions (e.g., U-shaped, L-shaped, hook-shaped, etc.) for engaging the underside of a substrate.

In exemplary embodiments, the latching members 408 are configured to be operable to not only hold the shield 400 in place during solder reflow, but also the latching member 408 help establish, maintain, or ensure good/close contact or co-planarity between mounting feet of the shield 400 and the PCB 404. This allows for the formation of a good solder joint. With the improved co-planarity, the minimum solder paste thickness may be reduced, thus allowing the shield 400 to be soldered to the PCB 404 using less solder.

In alternative embodiments, the latching members 408 may be operable to hold the shield 400 in place while also acting as a primary electrical conductive path to a ground plane of the PCB 404. In this example, there may be no soldering post installation and the latching members 408 may be electrically, galvanically connected to the PCB ground plane. Also in this example, the latching members 408 may be configured to engage the PCB 404 such that the shield 400 is securely retained to the PCB 404, without any need for further securement, welding, or mechanical fastening of the shield 400 to the PCB 404.

As disclosed above for the shield 100, the shield 400 may also be formed from a single piece of electrically-conductive material (e.g., single blank of material, etc.) so that the side walls 406, latching members 408, and contact members 416 have an integral, monolithic construction. A wide range of electrically-conductive materials may be used to form the shield 400, such as those disclosed above. In the illustrated embodiment, the latching members 408 and contact members 416 may be formed from resilient or compliant material to allow the latching members 408 to move while generally remaining within the same plane as the sidewall 406 from which they depend.

In the example embodiment shown in FIG. 11, the shield 400 includes four sidewalls 406 providing a generally rectangular shape. In other exemplary embodiments, shields may include more than or fewer than four sidewalls and/or in a configuration different from that shown in the figures herein. For example, the shield may have square configurations, triangular configurations, hexagonal configurations, other polygonal-shaped configurations, circular configurations, non-rectangular configurations, etc.

The shield's upper surface 434 includes apertures or holes 436 (FIG. 11). The holes 436 may be used for mating or connecting to another component.

By way of example only, a description will now be provided of an exemplary method by which the shield 400 may be attached to the PCB 104. The shield 400 may be placed on the PCB 404 such that the latching members 408 are inserted into the holes 412 in the PCB 404. A force may then be applied for causing the latching members 408 to move from their pre-installed configuration to their installed configuration. For example, an installer may place a finger against the upper surface 434 of the shield 400 and press downwardly with sufficient force to cause the latching members 408 to move from their pre-installed configuration to their installed configuration. Accordingly, the shield 400 is thus mechanically attached to the PCB 404. In some exemplary embodiments, the shield 400 may then also be soldered to the PCB 404. Alternatively, other manual methods or automatic methods (e.g., pick and place equipment, etc.) may be used for attaching the shield 400 to the PCB 404.

FIG. 15 illustrates another exemplary embodiment of a shielding apparatus 500 embodying one or more aspects of the present disclosure. In this particular embodiment, the shielding apparatus comprises a frame portion 500 to which may be attached a lid or cover. The lid or cover may be attachable to the frame portion 500 for substantially covering the frame's upper openings 505 defined by the frame's outer walls 506 and internal walls 507. The lid may be configured to fit generally over the frame portion 500, which, in turn, may be to a PCB (e.g., 104, 404, etc.) having holes (e.g., 112, 412, etc.) by way of the latching members 508. The latching members 508, contact members 516, and openings 520 of the frame portion 500 may be substantially similar and operate similarly to the corresponding features of the shield 400 disclosed above.

Also shown in FIG. 15, the frame portion 500 includes cross bracing or portions 540 for making electrical contact with a mating top piece or lid, to create an EMI shielding enclosure. Additionally, or alternatively, the flat portions 540 may be used for vacuum or mechanical pick and place operations.

The internal walls or dividers 507 of the frame portion 500 may cooperate with the lid or cover, for providing various EMI shielding compartments or sections. With the lid attached to the frame portion 500, the lid and frame portion 500 cooperatively define EMI shielding compartments within perimeters defined by the walls 506, 507. The outer walls 506 and internal walls 507 of the frame portion 500 and the lid's top surface would cooperate to define the EMI shielding compartments.

In the illustrated embodiment, the frame portion 500 has an open top that may be used, for example, to access components on a PCB contained within the frame portion 500 installed to the PCB when the lid or cover is not attached to the frame portion 500.

As noted above for some exemplary embodiments, the holes in the PCB and latching members may be located such that insertion of the latching members into the holes properly locates or aligns the shield to the PCB. This is also possible for the illustrated frame portion 500. Additionally, or alternatively, the frame portion 500 may also include thru-hole pins or pegs 540 for generally alignment purposes.

The frame portion 500 may be formed from a single piece of electrically-conductive material (e.g., single blank of material, etc.). A wide range of electrically-conductive materials may be used to form the frame portion 500, such as those disclosed above. In the illustrated embodiment, the latching members 508 and contact members 516 may be formed from resilient or compliant material to allow the latching members 508 to move while generally remaining within the same plane as the sidewall 506 from which they depend.

A lid may be attached to the frame portion 500 before or after the frame portion 500 is mechanically attached to a PCB via the latching members 508. For example, the frame portion 500 may initially be mechanically attached to a PCB by the latching members 508 in a similar manner as that disclosed above for the shield 400. A lid may then be positioned over the frame portion 500 and moved downward onto the frame portion 500 to facilitate attachment (e.g., via dimples/holes, etc.) of the lid thereto.

Further aspects of the present disclosure relate to methods of providing EMI shielding and installing an EMI shielding apparatus to a substrate. For example, a method will now be described for installing an electromagnetic interference (EMI) shielding apparatus (e.g., 100, 200, 300, 400, 500, etc.) to a substrate (e.g., 104, 304, 404, etc.) having one or more holes (e.g., 112, 312, 412, etc.). In this example embodiment, the method generally includes placing the shielding apparatus on the substrate to insert (e.g., slidably insert, etc.) one or more latching members (e.g., 108, 208, 308, 408, 508, etc.) of the shielding apparatus into the corresponding one or more holes in the substrate. A force may then be applied for compressing the shielding apparatus against the substrate to cause the one or more latching members to move relative to the shielding apparatus and substrate into engagement with the substrate, to thereby mechanically attach the shielding apparatus to the substrate.

The one or more holes may extend completely through the substrate from a top side to a bottom side of the substrate. The one or more end portions of the one or more latching members may be inserted completely though the corresponding one or more holes to engage the bottom side of the substrate. In other embodiments, the method may include frictionally engaging one or more end portions of the one or more latching members with corresponding inner sidewall portions within the one or more holes.

The application of the compressive force may cause the one or more latching members to move from a pre-installed configuration to an installed configuration in which one or more end portions of the one or more latching members are in contact with the substrate. The movement of the one or more latching members may be substantially within the same plane as the corresponding one or more walls from which the one or more latching members depend. The insertion of the one or more latching members into the corresponding one or more holes in the substrate may help locate or align the shielding apparatus relative to the substrate. The method may also include soldering at least a portion of the shielding apparatus to a corresponding portion of the substrate after the one or more latching members are engaged with the substrate and holding the shielding apparatus in place during the soldering.

Numerical dimensions and values are provided herein for illustrative purposes only. The particular dimensions and values provided are not intended to limit the scope of the present disclosure.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter. The disclosure of a first value and a second value for a given parameter can be interpreted as disclosing that any value between the first and second values could also be employed for the given parameter. Similarly, it is envisioned that disclosure of two or more ranges of values for a parameter (whether such ranges are nested, overlapping or distinct) subsume all possible combination of ranges for the value that might be claimed using endpoints of the disclosed ranges.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A shielding apparatus for use in providing electromagnetic interference (EMI) shielding for one or more components on a substrate, the shielding apparatus comprising:
   one or more walls;
   one or more latching members depending downwardly from the corresponding one or more walls; and
   the one or more latching members configured to be insertable into corresponding one or more holes in the substrate when the one or more latching members are in a pre-installed configuration and to thereafter engage the substrate when the one or more latching members are generally rotated relative to the one or more walls into an installed configuration in which the one or more latching members remain generally rotated, whereby the shielding apparatus is mechanically attached to the substrate.

2. The shielding apparatus of claim 1, wherein the one or more latching members are configured to be moved from the pre-installed configuration into the installed configuration while remaining substantially within the same plane as the corresponding one or more walls.

3. The shielding apparatus of claim 1, wherein:
   the one or more latching members depend vertically from the one or more walls when in the pre-installed configuration; and
   the one or more latching members are in a slanted orientation when in the installed configuration.

4. The shielding apparatus of claim 3, wherein the shielding apparatus includes an opening to accommodate movement of the one or more latching members from vertical to the slanted orientation.

5. The shielding apparatus of claim 1, wherein the one or more latching members include one or more end portions configured for engaging the substrate to thereby retain the shielding apparatus to the substrate.

6. The shielding apparatus of claim 5, wherein the one or more end portions each includes a latching surface configured to be latched under a lower portion of the substrate.

7. The shielding apparatus of claim 1, wherein:
   the one or more holes extend completely through the substrate from a top side to a bottom side of the substrate; and
   the one or more latching members include one or more end portions insertable completely though the corresponding one or more holes and engagable with the bottom side of the substrate to mechanically attach the shielding apparatus to the substrate.

8. The shielding apparatus of claim 1, further comprising a contact member configured to contact the substrate and move in a direction generally away from the substrate in response to a force applied to the shielding apparatus in a direction generally toward the substrate, which movement of the contact member reconfigures the one or more latching members from the pre-installed configuration to the installed configuration.

9. The shielding apparatus of claim 8, wherein the shielding apparatus includes an opening above the contact member to accommodate movement of the contact member in the direction generally away from the substrate.

10. The shielding apparatus of claim 1, wherein the one or more latching members are insertable into the one or more holes and engagable with the substrate by movement of and application of a force to the shielding apparatus towards the substrate in a direction generally parallel to a direction of insertion of the one or more latching members into the one or more holes.

11. The shielding apparatus of claim 1, wherein the one or more latching members and the one or more holes are located along the shielding apparatus and the substrate, respectively, such that insertion of the one or more latching members into the one or more holes properly locates the shielding apparatus to the substrate.

12. The shielding apparatus of claim 1, wherein:
   the engagement of the one or more latching members with the substrate improves co-planarity with respect to the EMI shielding apparatus mating to the substrate prior to soldering of the shielding apparatus to the substrate; or
   the one or more latching members are configured to engage the substrate such that the shielding apparatus is securely retained to the substrate, without any need for further securement, welding, or mechanical fastening of the shield to the substrate.

13. The shielding apparatus of claim 1, wherein the one or more latching members are integrally formed with or attached to the one or more walls.

14. The apparatus of claim 1, wherein the shielding apparatus comprises:
   a one piece shield including the one or more walls and a cover integral to the one or more walls; or
   a multi-piece shield including a frame having the one or more walls defining at least one opening along an upper portion of the frame, and a cover attachable to the frame for substantially covering the at least one opening of the frame;
   whereby the shielding apparatus is operable for shielding the one or more components on the substrate that are within an interior cooperatively defined by the one or more walls and the cover.

15. An electrical device including a printed circuit board having one or more holes therein and the shielding apparatus of claim 1 mechanically attached to the printed circuit board via the one or more latching members inserted into the corresponding one or more holes and engaged with the printed circuit board.

16. A shielding apparatus for use in providing electromagnetic interference (EMI) shielding for one or more components on a substrate, the shielding apparatus comprising:

one or more walls;

one or more latching members depending downwardly from the corresponding one or more walls, the one or more latching members configured to be insertable into corresponding one or more holes in the substrate when the one or more latching members are in a pre-installed configuration and to thereafter engage the substrate when the one or more latching members are caused to move relative to the one or more walls into an installed configuration, whereby the shielding apparatus is mechanically attached to the substrate;

wherein the one or more latching members have a length less than the thickness of the substrate such that one or more end portions of the one or more latching members are not insertable completely through the substrate; and the one or more end portions are frictionally engagable with corresponding inner sidewall portions within the one or more holes to mechanically attach the shielding apparatus to the substrate.

17. A shielding apparatus for use in providing electromagnetic interference (EMI) shielding for one or more components on a substrate, the shielding apparatus comprising:

one or more walls;

one or more latching members depending downwardly from the corresponding one or more walls, the one or more latching members configured to be insertable into corresponding one or more holes in the substrate when the one or more latching members are in a pre-installed configuration and to thereafter engage the substrate when the one or more latching members are caused to move relative to the one or more walls into an installed configuration, whereby the shielding apparatus is mechanically attached to the substrate; and a contact member configured to contact the substrate and move in a direction generally away from the substrate in response to a force applied to the shielding apparatus in a direction generally toward the substrate, which movement of the contact member reconfigures the one or more latching members from the pre-installed configuration to the installed configuration;

wherein the contact member includes:

a first configuration when the one or more latching members are in the pre-installed configuration and disengaged from the substrate; and a second configuration when the one or more latching members are in the installed configuration and engaged with the substrate, whereby flexing of the contact member from the first configuration into the second configuration generates a clamping force applied to the substrate generally between the contact member and the one or more latching members.

18. A shielding apparatus for use in providing electromagnetic interference (EMI) shielding for one or more components on a substrate, the shielding apparatus comprising:

one or more walls;

one or more latching members depending downwardly from the corresponding one or more walls, the one or more latching members configured to be insertable into corresponding one or more holes in the substrate when the one or more latching members are in a pre-installed configuration and to thereafter engage the substrate when the one or more latching members are caused to move relative to the one or more walls into an installed configuration, whereby the shielding apparatus is mechanically attached to the substrate;

wherein the one or more latching members include a pair of generally opposing latching members having a contact member therebetween; and the contact member is configured to contact the substrate and move in a direction generally away from the substrate in response to a force applied to the shielding apparatus in a direction generally toward the substrate, which movement of the contact member causes the pair of generally opposing members to move inwardly towards each other to engage the substrate therebetween.

19. A method of installing an electromagnetic interference (EMI) shielding apparatus to a substrate having one or more holes, the method comprising:

placing the shielding apparatus on the substrate to insert one or more latching members of the shielding apparatus into the corresponding one or more holes in the substrate; and applying a force for compressing the shielding apparatus against the substrate to cause the one or more latching members to move relative to the shielding apparatus and the substrate into engagement with the substrate, to thereby mechanically attach the shielding apparatus to the substrate;

wherein the application of the compressive force causes the one or more latching members to move from a first angular orientation in a pre-installed configuration to a second angular orientation in an installed configuration in which one or more end portions of the one or more latching members are in contact with the substrate, the second angular orientation different from the first angular orientation.

20. The method of claim 19, wherein:

the one or more holes extend completely through the substrate from a top side to a bottom side of the substrate and one or more end portions of the one or more latching members are inserted completely though the corresponding one or more holes to engage the bottom side of the substrate; or the method includes frictionally engaging one or more end portions of the one or more latching members with corresponding inner sidewall portions within the one or more holes.

21. The method of claim 19, wherein the insertion of the one or more latching members into the corresponding one or more holes in the substrate helps locate the shielding apparatus relative to the substrate.

22. The method of claim 19, wherein the movement of the one or more latching members is substantially within the same plane as the corresponding one or more walls from which the one or more latching members depend.

23. The method of claim 19, wherein:

the method includes soldering at least a portion of the shielding apparatus to a corresponding portion of the substrate after the one or more latching members are engaged with the substrate and holding the shielding apparatus in place during the soldering.

24. The method of claim 19, wherein the method includes slidably inserting the one or more latching members within the corresponding one or more holes.

25. A device comprising:
a printed circuit board including a ground plane and one or more holes therein; and
a shielding apparatus having one or more latching members within the one or more holes, each latching member connected, generally at a connecting portion of the shielding apparatus, to a contact member against which the circuit board presses such that the latching member and contact member are generally rotated relative to the connecting portion and such that the latching member is generally in a slanted orientation within the hole, the one or more latching members having one or more end portions engaged with the printed circuit board thereby mechanically attaching the shielding apparatus to the printed circuit board;
wherein the one or more latching member are electrically connected to the ground plane thereby providing an electrically conductive path from the shielding apparatus to the ground plane, or the shielding apparatus is soldered to the printed circuit board.

* * * * *